United States Patent
Nguyen et al.

(10) Patent No.: US 6,600,337 B2
(45) Date of Patent: Jul. 29, 2003

(54) LINE SEGMENTATION IN PROGRAMMABLE LOGIC DEVICES HAVING REDUNDANCY CIRCUITRY

(75) Inventors: Triet Nguyen, San Jose, CA (US); Changsong Zhang, San Jose, CA (US); David Jefferson, Morgan Hill, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/844,077

(22) Filed: Apr. 26, 2001

(65) Prior Publication Data

US 2002/0003742 A1 Jan. 10, 2002

Related U.S. Application Data

(60) Provisional application No. 60/199,751, filed on Apr. 26, 2000.

(51) Int. Cl.⁷ .............................. H03K 19/177
(52) U.S. Cl. ........................... 326/41; 326/38
(58) Field of Search ..................... 326/37–41

(56) References Cited

U.S. PATENT DOCUMENTS

| | | | |
|---|---|---|---|
| 4,899,067 A | | 2/1990 | So et al. |
| 5,369,314 A | | 11/1994 | Patel et al. |
| 5,434,514 A | | 7/1995 | Cliff et al. |
| 5,485,102 A | * | 1/1996 | Cliff et al. ............ 326/10 |
| 5,504,440 A | * | 4/1996 | Sasaki ............... 326/41 |
| 5,592,102 A | | 1/1997 | Lane et al. |
| 5,627,480 A | * | 5/1997 | Young et al. ........... 326/82 |
| 5,942,913 A | * | 8/1999 | Young et al. ........... 326/41 |
| 6,034,536 A | | 3/2000 | McClintock et al. |
| 6,107,820 A | | 8/2000 | Jefferson et al. |

FOREIGN PATENT DOCUMENTS

| | | |
|---|---|---|
| GB | 2 283 602 | 5/1995 |
| GB | 2 321 989 | 8/1998 |
| WO | WO 98/53401 | 11/1998 |

OTHER PUBLICATIONS

IBM Corporation, "Implementation of Diagnostics and Redundancy on a Programmable Logic Array", IBM Technical Disclosure Bulletin, vol. 28, No. 6 Nov. 1983.

Chin–Long Wey, "On Yield Consideration for the Design of Redundant Programmable Logic Arrays", 24th ACM/IEEE Design Automation Conference, 1987.

Demjanenko et al., "Yield Enhancement of Field Programmable Logic Arrays by Inherent Component Redundancy", IEEE Transactions on Computer–Aided Design, vol. 9, No. 8, Aug. 1990.

* cited by examiner

Primary Examiner—Don Le
(74) Attorney, Agent, or Firm—Townsend and Townsend and Crew LLP; J. Matthew Zigmant

(57) ABSTRACT

Methods and apparatus for segmenting lines in programmable logic devices having redundancy circuitry. A programmable logic device includes a first plurality of logic array blocks. The first plurality of logic array blocks includes a first logic array block and a second logic array block, a first programmable interconnect line coupled to a segmentation buffer and programmably coupled to the first logic array block, and a second programmable interconnect line coupled to the segmentation buffer and programmably coupled to the second logic array block. The segmentation buffer is capable of selectively providing an open circuit between the first programmable interconnect line and the second programmable interconnect line, a buffer driving signals from the first programmable interconnect line to the second programmable interconnect line, or a buffer driving signals from the second programmable interconnect line to the first programmable interconnect line.

20 Claims, 16 Drawing Sheets

Symbolic Truth Table 1100

| Settings with no bad rows | | Bat Row at | Driver Location | Updated Settings | |
|---|---|---|---|---|---|
| Main Buffer | Stitch Buffer | | | Main Buffer | Stitch Buffer |
| seg | st | U1 | near | up | seg |
| seg | st | U1 | far | dn | seg |
| up | st | U1 | near | ILLEGAL | ILLEGAL |
| up | st | U1 | far | up | st |
| dn | st | U1 | near | up | st |
| dn | st | U1 | far | dn | st |
| seg | st | U2 | near | seg | st |
| seg | st | U2 | far | seg | st |
| up | st | U2 | near | ILLEGAL | ILLEGAL |
| up | st | U2 | far | dn | st |
| dn | st | U2 | near | dn | st |
| dn | st | U2 | far | dn | st |

1170: seg/seg (row 1)
1190: seg/seg (row 2)
1180: dn row
1195: dn row
1110, 1120, 1130, 1140, 1150, 1160

DEFINITION

- seg : segmented
- up : driving upward
- dn : driving downward
- st : stiching (pass through)
- U1 : above Main Buffer
- U2 : below Main Buffer
- near : Driver located at row just above Main Buffer
- far : Driver not located at row just above Main Buffer
- ILLEGAL : This configuration does not occur Main Buffer : The Main Buffer has three modes:
1. Driving upward-up
2. Driving downward-dn
3. Segmented-seg Stich Buffer : The Stich Buffer has two modes:
1. Stiching (pass through)-st
2. Segmented-seg

FIG. 11

Truth Table 1200

| | RLTRT L | RRTLT R | NeFa N | U1 U | RLTRTx Lx | RRTLTx Rx | Sub_Buf S |
|---|---|---|---|---|---|---|---|
| 1230 up | 0 | 1 | 1 | 1 | x | x | x |
| 1240 illegal | 1 | 1 | 1 | 1 | x | x | x |
| 1250 segmented | 0 | 0 | 1 | 1 | 0 | 1 | 0 |
| 1260 dn | 1 | 0 | 1 | 1 | 0 | 1 | 1 |
| up | 0 | 1 | 0 | 1 | x | x | x |
| illegal | 1 | 1 | 0 | 1 | x | x | x |
| segmented | 0 | 0 | 0 | 1 | 1 | 0 | 0 |
| dn | 1 | 0 | 0 | 1 | 1 | 0 | 1 |
| up | 0 | 1 | 1 | 0 | x | x | x |
| illegal | 1 | 1 | 1 | 0 | x | x | x |
| segmented | 0 | 0 | 1 | 0 | 0 | 1 | 1 |
| dn | 1 | 0 | 1 | 0 | 1 | 0 | 1 |
| up | 0 | 1 | 0 | 0 | x | x | x |
| illegal | 1 | 1 | 0 | 0 | x | x | x |
| segmented | 0 | 0 | 0 | 0 | 0 | 0 | 1 |
| dn | 1 | 0 | 0 | 0 | 1 | 0 | 1 |

1212 / 1214 / 1216 / 1218 / 1222 / 1224 / 1226

1270:
$$RLTRTx = Lx = L*(U\_bar) + (N\_bar)*U*(R\_bar)$$
$$RRTLTx = R + (N*U)$$
$$Sub\_Buf = U\_bar + R + L$$

FIG. 12

LINE SEGMENTATION IN PROGRAMMABLE LOGIC DEVICES HAVING REDUNDANCY CIRCUITRY

This application claims the benefit of U.S. Provisional Application No. 60/199,751, filed Apr. 26, 2000.

BACKGROUND OF THE INVENTION

The present invention relates to programmable logic integrated devices (PLDs), and more specifically to techniques and circuitry for implementing vertical line segmentation in a manner that does not conflict with the use of redundancy circuitry.

PLDs have become ubiquitous over the last several years, and are now used in equipment in every major electronics market including telecommunications, data communications, computer peripheral, and industrial, to name just a few. They are a key component in specialized systems in the area of biotechnology, video, automotive, personal computers, and network switches and routers. As the use of PLDs has increased, competition in the marketplace has become fierce, and the price that PLDs command continues to decrease. To improve and maintain profit margins in such an environment, manufactures seek to reduce every element that contributes to the cost of their products.

One key element is the cost of the integrated circuit die. Cost variables include die size and yield. A smaller die results in more total, or gross die on each wafer manufactured. A higher yield means less of the gross die need to be discarded, and more can be sold.

A relatively large portion of a PLD's die area is allocated to routing resources such as programmable interconnect. If one logic element is connected to another, at least one routing line, or trace is used. If the trace is longer than required, the extra trace length results in wasted die area. When this happens, the die cost is increased unnecessarily. One way to shorten these traces is to segment them into separate line portions. This allows one line to carry more than one signal, since each segmented portion can connect different logic elements together.

Redundancy circuitry is used in integrated circuits to improve the manufacturing yield of good dies. When an integrated circuit has a particular circuit that does not function correctly, the integrated circuit is discarded. But if redundancy circuitry is included on-chip, it can replace the nonfunctioning circuitry. In this way, the integrated circuit is made to function properly and can be sold.

Therefore, it is desirable to provide for line segmentation on PLDs in a manner consistent with the use of redundancy circuitry, such that die size may be minimized while allowing yield improvement.

SUMMARY OF THE INVENTION

Accordingly, various embodiments of the present invention provide main and stitch buffers along with a redundant row of logic array blocks. The main buffers, also referred to as segmentation buffers, provide assistance in driving long lines, and can be configured as drivers capable of sending signals either direction along a trace. The main buffers can further be configured as open circuits, such that the segmented portions of a line can carry separate and distinct signals. The redundant row takes the place of a defective row in the PLD. The replacement occurs as the functionality of each row, beginning with the defective one, is moved one row towards the redundant position.

But this shifting requires the alteration of the main buffer's configuration in some instances. This alteration depends on the main buffer's initial state, the location of the defective row, as well as the location of the circuitry driving signals on the line. A stitch buffer is added to preserve line segmentation in those circumstances where the main buffer changes from an open circuit to a driver.

It is very desirable to not have to change the programming of a PLD to compensate for the existence of location of a defective row. That is, each device, whether it has a defective row or not, should look the same to a user. Accordingly, an embodiment of the present invention provides for storing data on-chip regarding the location of circuits driving vertical lines, as well as the instructions which tell a row whether to shift for redundancy purposes. This stored data is then used to modify the PLD programming on-chip, resulting in alterations to the instructions provided to the main and stitch buffers.

One exemplary embodiment of the present invention provides a programmable logic device including a first plurality of logic array blocks. The first plurality of logic array blocks includes a first logic array block and a second logic array block, a first programmable interconnect line coupled to a segmentation buffer and programmably coupled to the first logic array block, and a second programmable interconnect line coupled to the segmentation buffer and programmably coupled to the second logic array block. The segmentation buffer is capable of selectively providing an open circuit between the first programmable interconnect line and the second programmable interconnect line, a buffer driving signals from the first programmable interconnect line to the second programmable interconnect line, or a buffer driving signals from the second programmable interconnect line to the first programmable interconnect line.

The embodiment may further include a second plurality of logic array blocks, wherein the second plurality of logic array blocks are redundant, and are used to replace at least some of the first plurality of logic array blocks when one of the first plurality of logic array blocks are defective.

A further exemplary embodiment of the present invention provides a programmable logic device including a first plurality of logic array blocks arranged contiguously plurality of segmentation buffers arranged contiguously and along a side of the first plurality of logic array blocks, a second plurality of logic array blocks arranged contiguously and along a side of the plurality of segmentation buffers away from the first plurality of logic array blocks, and a plurality of stitch buffers arranged contiguously and along a side of the second plurality of logic array blocks away from the plurality of segmentation buffers. The device also includes a third plurality of logic array blocks arranged contiguously and along a side of the plurality of stitch buffers away from the second plurality of logic array blocks, and a fourth plurality of logic array blocks arranged contiguously and along a side of the third plurality of logic gates away from the plurality of stitch buffers.

Interconnect is also provided, specifically a first plurality of interconnect lines programmably coupled to the first plurality of logic array blocks and coupled to the plurality of segmentation buffers, a second plurality of interconnect lines programmably coupled to the second plurality of logic array blocks, and coupled to the plurality of segmentation buffers and to the plurality of stitch buffers, and a third plurality of interconnect lines programmably coupled to the third plurality of logic array blocks and the fourth plurality of logic array blocks, and coupled to the plurality of stitch buffers. The plurality of segmentation buffers are capable of being configured to drive signals from the first plurality of interconnect lines to the second plurality of interconnect lines, or to drive signals from the second plurality of interconnect lines to the first plurality of interconnect lines, or to provide an open circuit between the first plurality of interconnect lines and the second plurality of interconnect lines.

Yet a further exemplary embodiment of the present invention provides a method of segmenting programmable interconnect lines in a programmable logic device. The device includes a plurality of rows of logic array blocks, a segmentation buffer, and a redundant row of logic array blocks. The method includes determining whether a defective logic array block exists, and if no defective logic array block exists, making no changes to the segmentation buffer, otherwise a location of a defective logic array block is determined. If the location of the defective logic array block is between the segmentation buffer and the redundant row of logic array blocks, then no changes are made to the segmentation buffer, otherwise the location of an active line driver is determined for a line coupled to the segmentation buffer. If the location of the active line driver is in a row of logic blocks next to the segmentation buffer but not between the segmentation buffer and the redundant row of logic blocks, the segmentation buffer is set to drive signals from logic array blocks between the segmentation buffer and the redundant row to logic array blocks not between the segmentation buffer and the redundant row, otherwise the segmentation buffer is set to drive signals from logic array blocks not between the segmentation buffer and the redundant row to logic array blocks between the segmentation buffer and the redundant row.

A better understanding of the nature and advantages of the present invention may be gained with reference to the following detailed description and the accompanying drawings.

BRIEF DESCRIPTION OF THE DRAWINGS

FIG. 11 is a symbolic truth table for determining updated control settings for the main and stitch buffers in one embodiment of the present invention;

FIG. 12 is a Boolean truth table implementing the symbolic truth table of FIG. 11;

DETAILED DESCRIPTION

Figure 1:
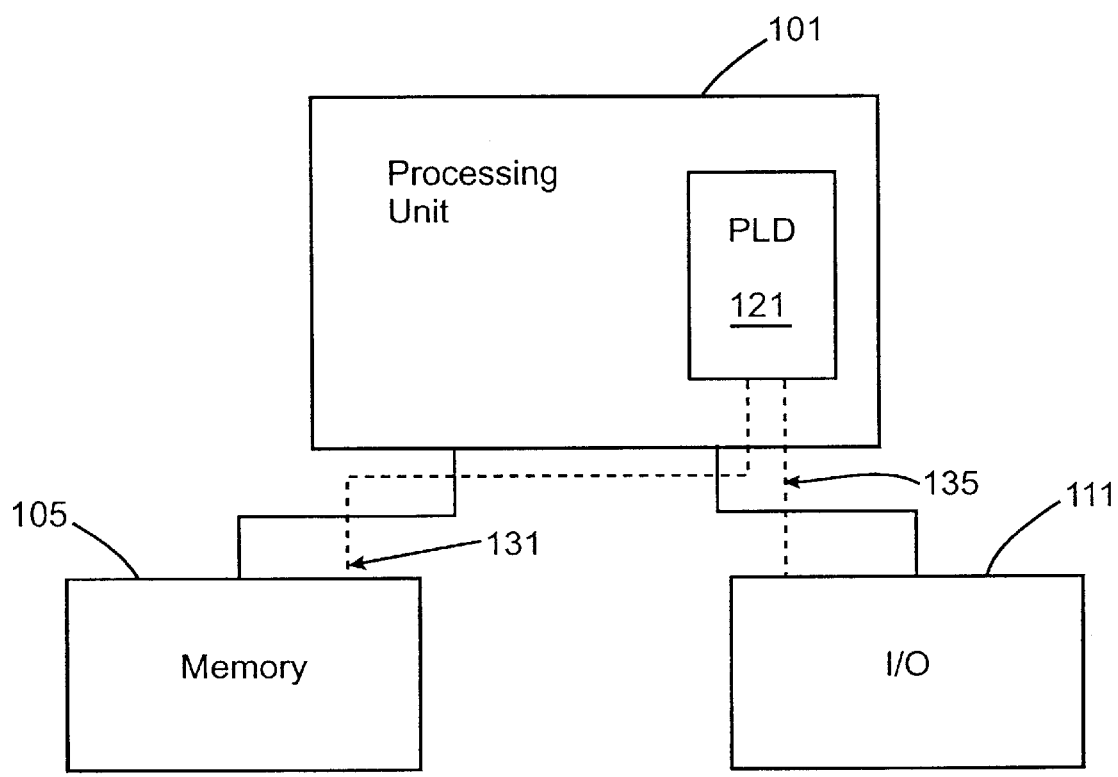
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the *Altera Data Book* (1999). Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
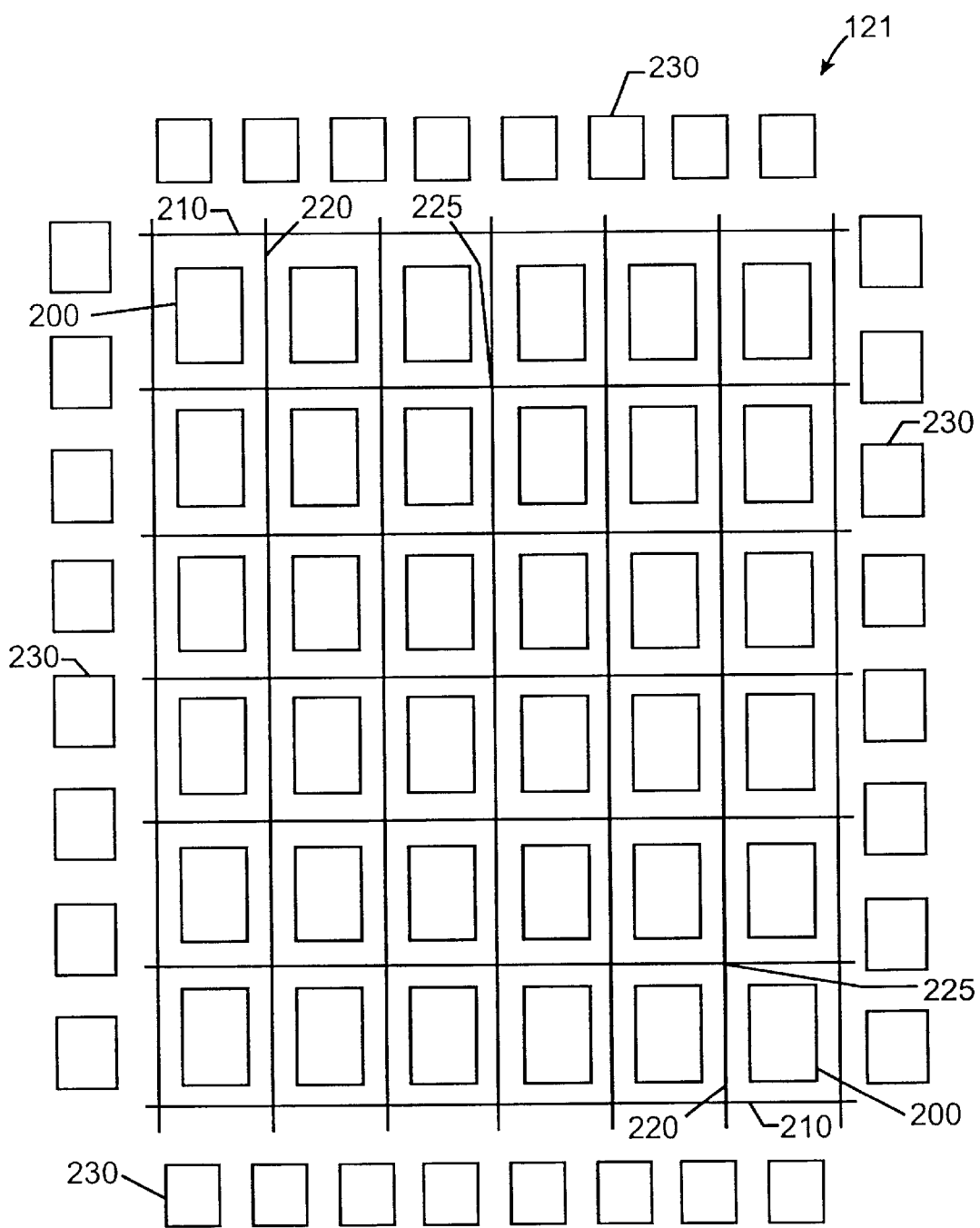
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bi-directional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 3:
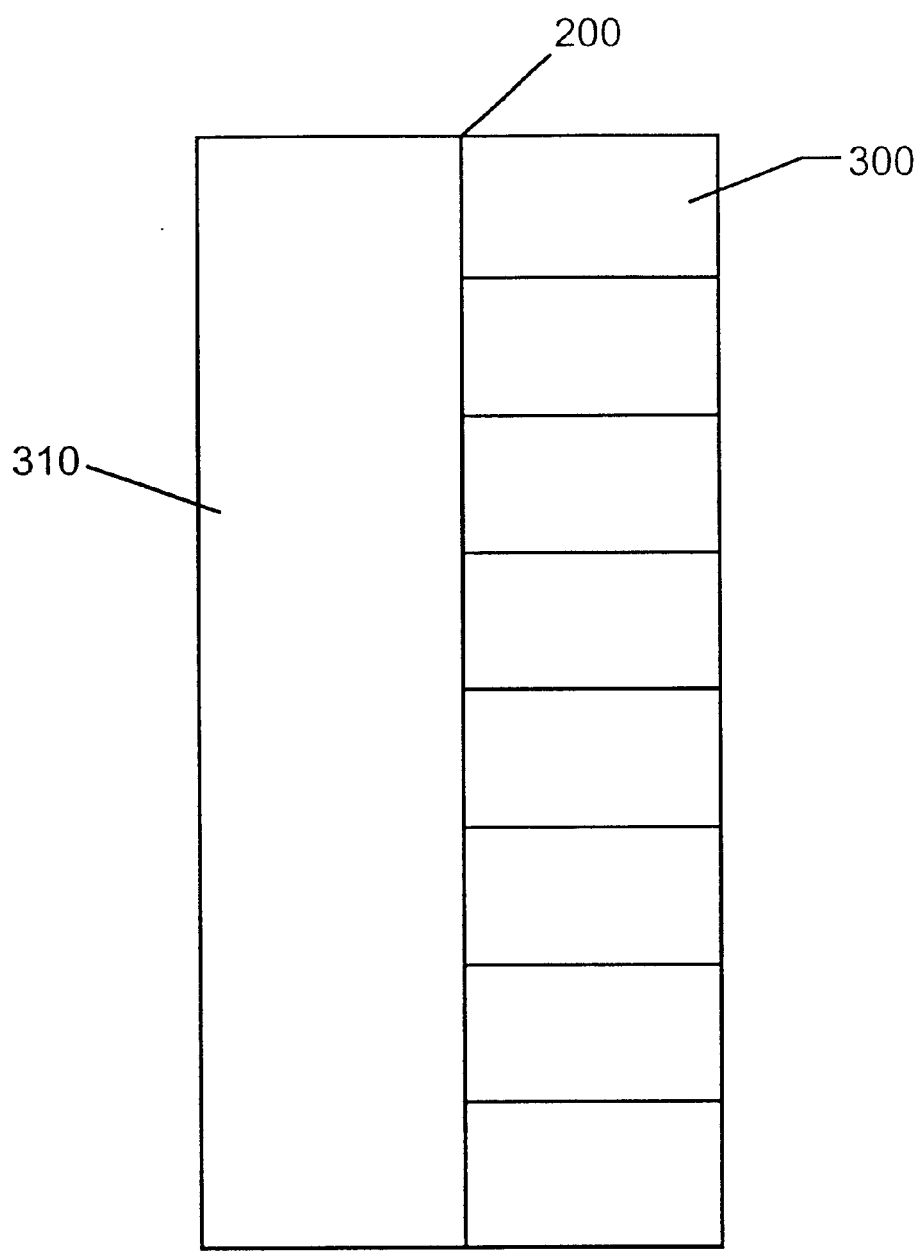
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
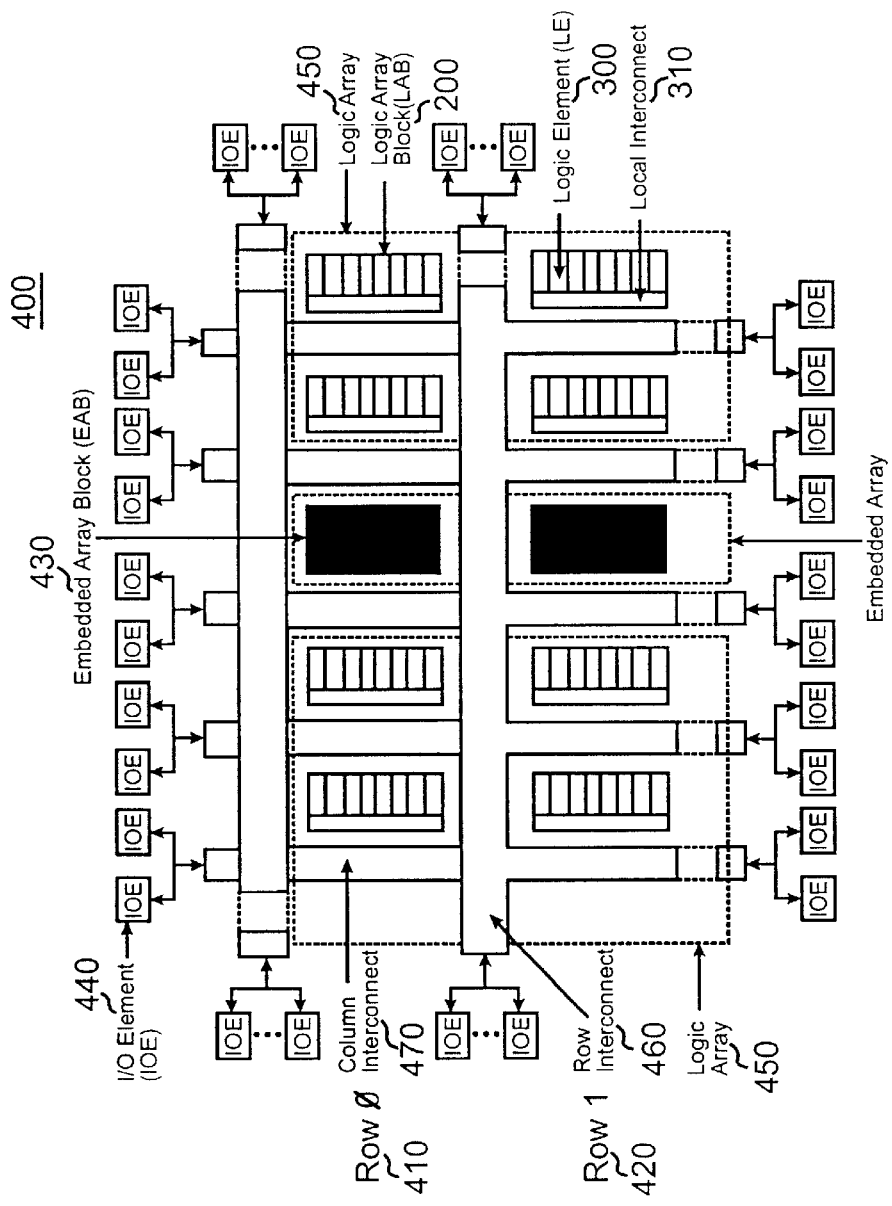
FIG. 4 shows an architecture of a programmable logic integrated circuit with embedded array blocks (EABs)

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550, 782.

Also included are input/output elements 440, column interconnect buses 470, row interconnect buses 460, and logic arrays 450. Logic arrays 450 include LABs 200, which in turn contain LEs 300 and local interconnects 310. Two rows are shown, specifically Row 0 410 and Row 1 420. Various PLDs consistent with the present invention may have more rows. For example, a PLD may have 60 or more rows. This flexible interconnect structure allows logic elements throughout a PLD to connect to each other. For example, logic elements 300 in Row 0 410 may connect to other logic elements 300 in Row 0 410 by way of row interconnect lines in row interconnect bus 460. Logic elements 300 in Row 0 410 may connect to logic elements 300 in Row 1 420 by way of one or more lines in the column interconnect bus 470, or by way of one more lines in column interconnect bus 470 in combination with one more lines of row interconnect bus 460.

Figure 5:
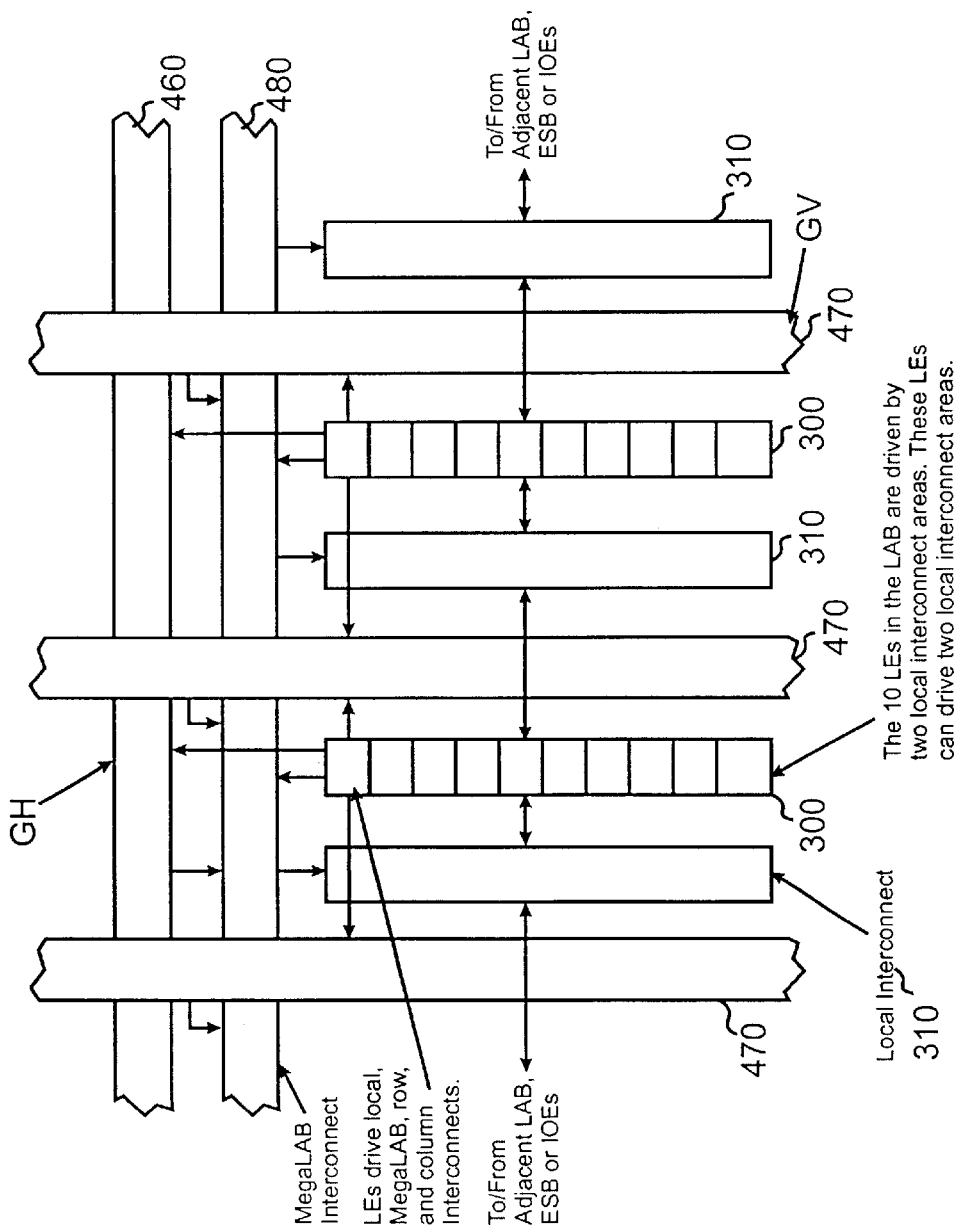
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The mega-LAB interconnect can be programmably connected to GVs, GHs, and the local interconnect of each LAB of the mega-LAB. Compared to the architecture of FIG. 2, this architecture has an additional level of interconnect, the megaLAB interconnect. Such an architecture is found in Altera's APEX™ family of products, which is described in detail in the *APEX 20K Programmable Logic Device Family Data Sheet* (August 1999). In a specific implementation, a mega-LAB also includes an embedded system block (ESB) to implement a variety of memory functions such as CAM, RAM, dual-port RAM, ROM, and FIFO functions.

FIG. 5 is a more detailed representation of LEs 300 in LABs 200 and their possible connections to the programmable interconnect lines. Included are logic elements 300, vertical or column interconnect buses 470, horizontal or row interconnect buses 460, and local interconnect buses 310. Each LE 300 may connect to two local interconnect buses 310 as indicated. Each LE 300 may also connect to two vertical or column interconnect buses 470, as well as at least one row interconnect bus 460, and megaLAB interconnect buses 480. This highly flexible routing scheme enables an individual LE to couple to neighboring LEs, to LEs in the same row, or to LEs in different rows.

Figure 6:
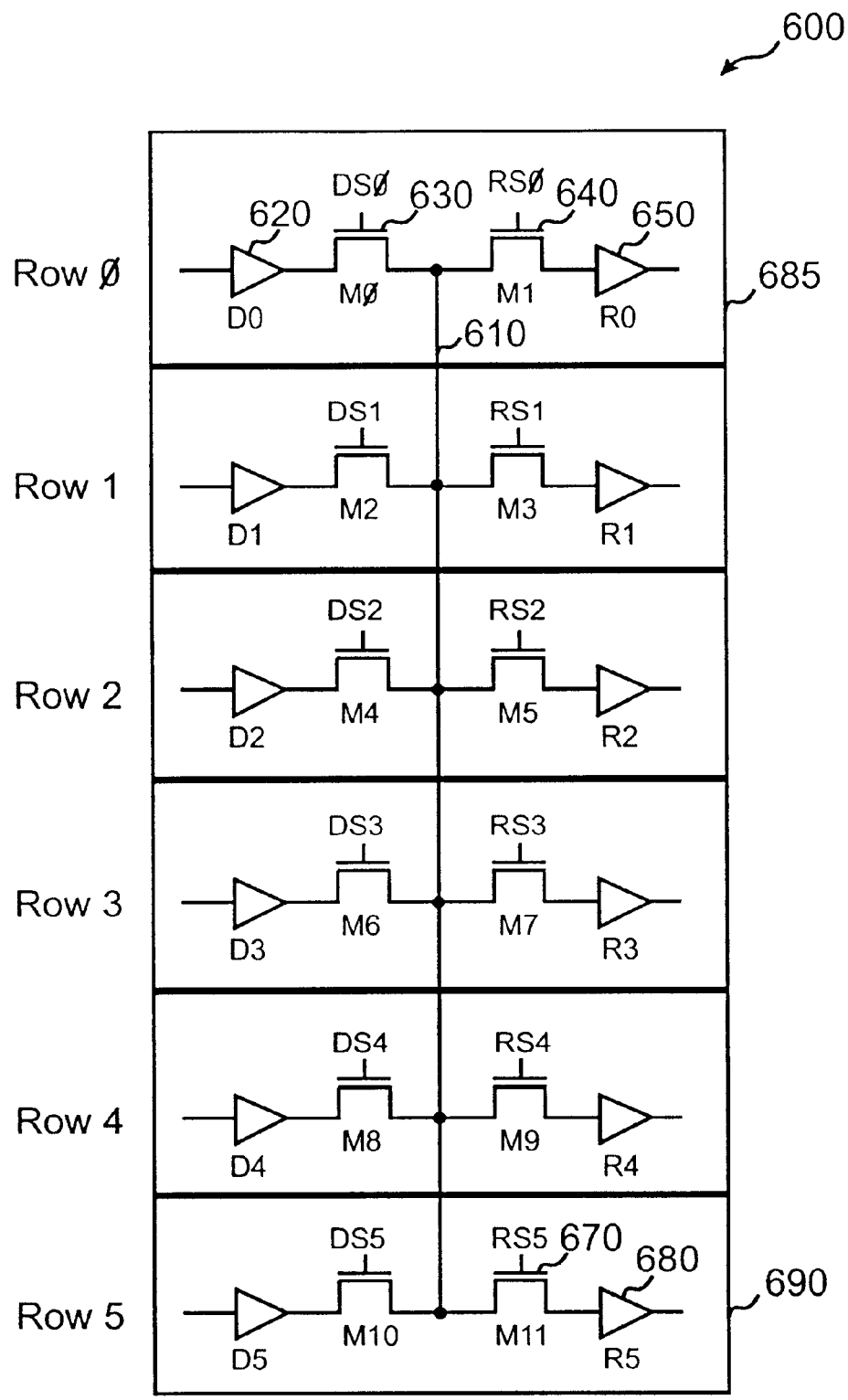
FIG. 6 is a portion of a PLD including a vertical trace.

FIG. 6 is a representation of a simplified portion 600 of a PLD. Included is one line or GV (or trace) 610 of a vertical (or column) interconnect bus 470. Various drivers, receive circuits, horizontal interconnect lines GHs, megaLAB interconnections, and the like, may be programmably coupled to the vertical line 610. Only drivers shown here for simplicity. For example, a driver D0 620 at Row 0 685 may couple through the device M0 630 to the vertical trace 610. If M11 670 is conducting, the signal is received by the receive circuit R5 680 in Row 5 690. In a similar manner, signals from LEs in any of the six rows shown may be received by one or more of the receive circuits of Row 0 685 through Row 5 690.

Figure 7:
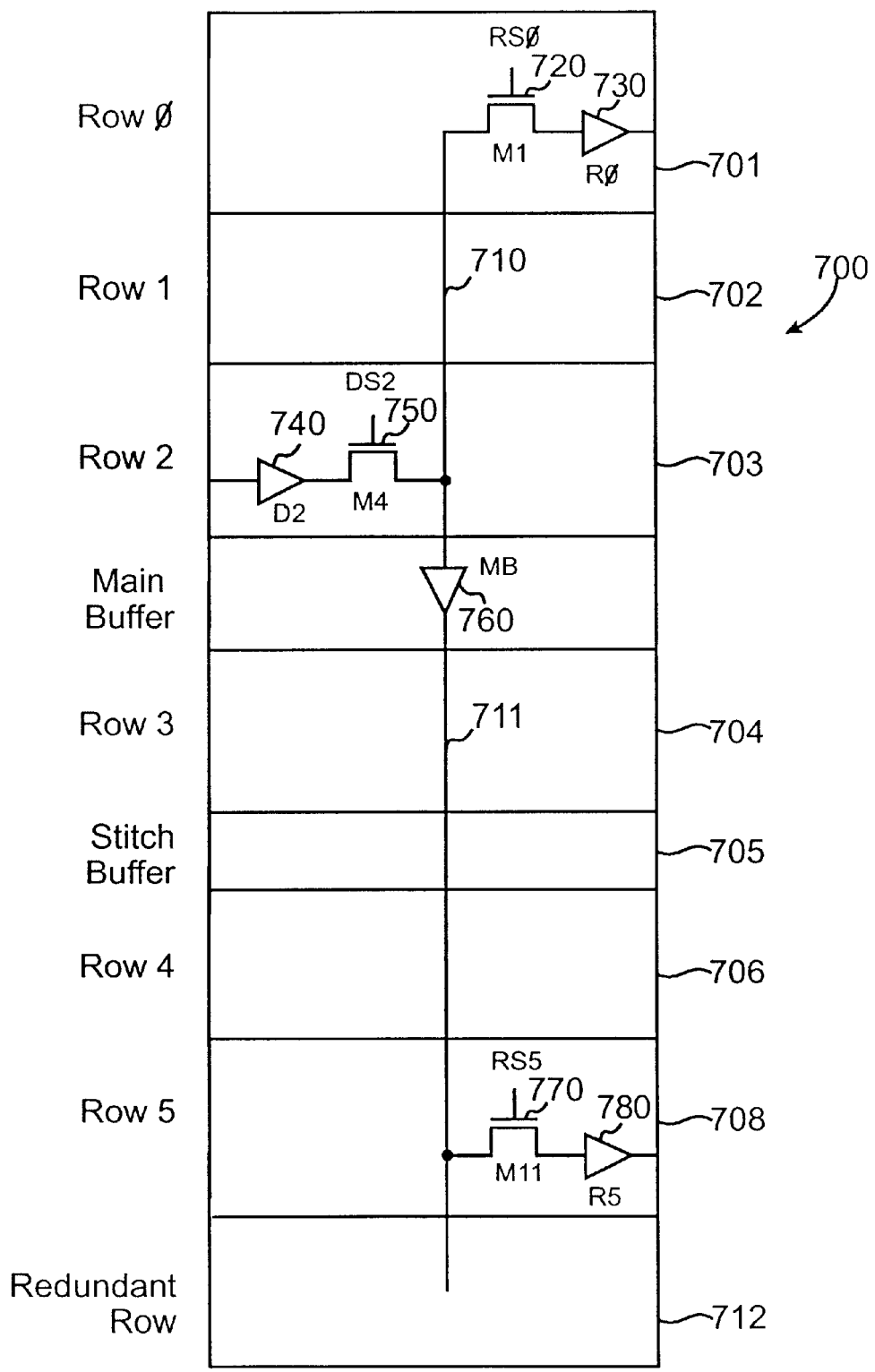
FIG. 7 is a portion of a PLD including a redundant row and a vertical trace with main and stitch buffers.

FIG. 7 is a representation of a simplified portion 700 of a PLD consistent with one embodiment of the present invention. Included is a GV or one line 710 of a vertical interconnect bus 470. In this illustrative example, drive circuit D2 740 provides a signal through M4 750 to receive circuits R0 730 in Row 0 701 and R5 780 in Row 5 708 through devices M1 720 and M11 770 respectively. Again, a vertical line is shown; the line may alternately be horizontal, or the line may be nonorthogonal. Also, a combination of vertical, horizontal, and nonorthogonal lines may be used. Rows are also discussed; alternately, redundant columns may be used by various embodiments of the present invention.

The lengths of these vertical lines can be relatively long. The number of rows may be larger than the representative 5 rows shown here, and the vertical line 710 may run through them all. For example, there may be 60 rows. Alternately, there may be more than 60 rows, or less than 60 rows. In some embodiments, there may be 120 or more rows. This long line length translates to a large amount of capacitance to be driven by a driver such as D2 740. This results in an increase in signal delay. Moreover, in some instances, the entire length of line is not necessary. For example, a driver in Row 2 703 may only need to be connected to a receiver in Row 0 701. In that case, the rest of the line below Row 2 703 is wasted, and creates an unnecessary load on the driver D2 740.

To mitigate these problems, one embodiment of the present invention provides for dividing a vertical line into two portions, shown here as 710 and 711. These two line portions are coupled together by a Main Buffer 760. Main Buffer 760 can be configured three different modes. The Main Buffer 760 may be configured to drive in a downward direction, such that driver D2 740 has assistance in driving the vertical trace portion 711. The Main Buffer 760 may alternately be configured to drive in the upward direction, such that a driver in the lower rows (below the Main Buffer 760) may drive the vertical trace portion 710, such that a signal may be sent to receiver R0 730. The Main Buffer 760 may also be configured as an open circuit. In this case, one vertical line having two separate line portions can be used to carry two signals to two separate destinations. In one example, the driver D2 740 in Row 2 703 drives the receiver R0 730 in Row 0 701, while a driver in Row 3 704 simultaneously drives the receiver R5 780 in Row 5 708.

By adding a configurable Main Buffer 760, circuits which drive an entire vertical line receive assistance from a main buffer. This reduces the capacitive load on the driving circuit, and improves their AC performance.

The integrated circuit portion 700 of FIG. 7 also includes a Redundant Row 712. Ordinarily, if there is a defect which renders the circuitry of a row nonfunctional, the entire device is discarded. But if an extra row is added, that row can replace the defective row, resulting in a fully functional device. The redundant row may directly replace the non-functional row. Alternately, a method used by an embodiment of the present invention is to move the circuitry associated with each row at or below the defective row, down by one row. For example, if a manufacturing defect is such that Row 2 703 is unusable, the functionality of Row 2 703 moves to the location labeled as Row 3 704; that is to say Row 3 704 is configured as Row 2 703 would have been save for the defect. Since Row 3 704 has been displaced, it moves to Row 4 706. Similarly, the functionality of Row 4 706 moves to Row 5 708, and Row 5 708 moves into the vacant Redundant Row 712.

A complication arises when a row, specifically in this example, Row 2 703, moves from one side of the Main Buffer 760 to the other. If there is no defect in Row 2 703, the driver D2 740 in Row 2 703 drives the receiver R0 730 in Row 0 and the Main Buffer 760, which in turn drives the receiver R5 780 in Row 5. Accordingly, the proper set-up for the Main Buffer 760 in the absence of a defect in Row 2 703 is the driving downward configuration.

But if there is a defect in Row 2 703, then the circuitry associated with Row 2 703 moves into the location labeled as Row 3 704. This means that the driver D2 740 is now driving line portion 711, the same line portion driven by the Main Buffer 760. It is very undesirable to have two line drivers outputs actively coupled to the same line. The signal level on the line is undetermined and is a function of the relative strength of the driver D2 740 and Main Buffer 760. Moreover, since the main buffer is configured to drive signals in the other direction, the signal from driver D2 740 is not be able to reach the receive circuit R0 730 in Row 0. From this example, if can be seen that if the redundancy circuit is used, the configuration of the Main Buffer 760 may have to change. One embodiment of the present invention and overcomes this problem by reversing the polarity of the Main Buffer 760. Specifically, in this instance, the Main Buffer 760 reverses direction into the upward driving configuration, such that the driver D2 740 drives the receiver R5 780 in Row 5 708 as well as the Main Buffer 760, which in turn drives receiver R0 730 in Row 0 701. Depending on the configuration, and the location of a bad row which is to be replaced, a Stitch Buffer 705 is required. This Stitch Buffer 705 is located below the row below the Main Buffer 760. Examples of why and when a stitch buffer is needed are shown in the description of the following figure.

If for each row there is only one other row to which its functionality may be shifted, then only one stitch buffer is needed. If the row functions shift to neighboring rows, the stitch buffer should be separated from the main buffer by one row. But if there is more than one row to which a given row's functionality may be moved, then more than one stitch buffer is needed. For example, if there are two rows into which a row's functionality may be shifted, then two stitch buffers are needed. In this case, if the functions are shifted to neighboring rows, then one stitch buffer should be separated from the main buffer by one row, the other by two rows, and the separations should be in the direction of the shifting.

In the architecture of Altera's APEX device family, typically, each time a segmentation buffer is to be added onto the vertical line, additional redundancy rows need to be added in order for the redundancy circuitry to work correctly. This would increase the die size, which increases the cost.

In the present invention, vertical lines segmentation is implemented without the need of adding additional redundancy rows. The invention uses additional logic to steer signals appropriately in normal parts as well as in bad parts without the need for using additional redundancy row in the bad parts.

Additional logical circuitry is used to implement this new redundancy scheme. However, this logic addition is much more efficient than adding more redundancy rows.

Among the numerous advantages of this new redundancy scheme on vertical line segmentation are (1) a simple change to the current control logic, and (2) no need for additional redundancy rows, hence smaller die size. The new redundancy scheme on vertical line segmentation does require (1) additional configuration ram bits for redundancy control logic, and (2) change of the existing control logic of the segmentation buffer.

Figure 8:
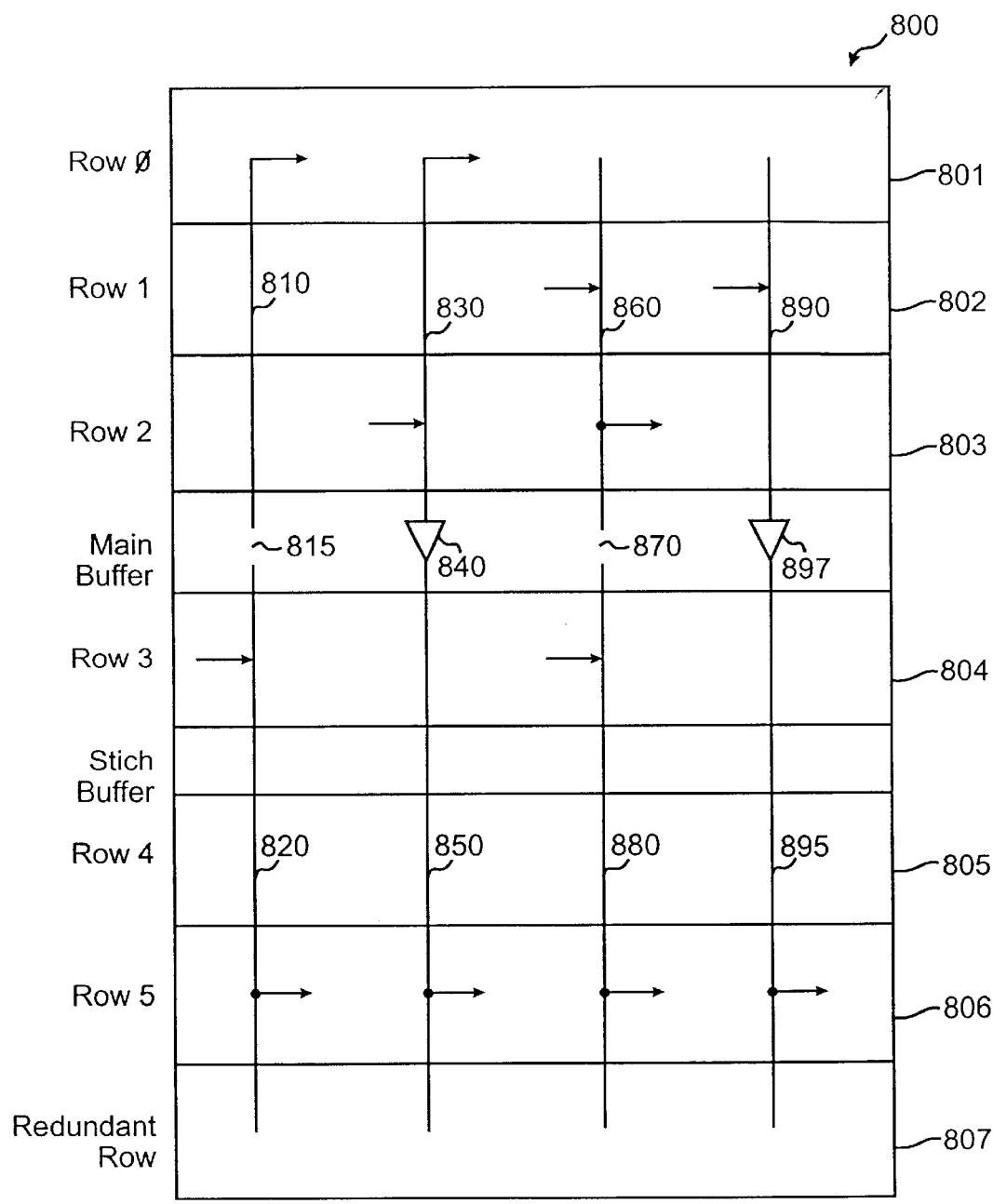
FIG. 8 is a portion of a PLD including a redundant row and four vertical traces with main and stitch buffers.

FIG. 8 is a representative portion 800 of a programmable logic device which may be formed on an integrated circuit. Included are rows of logic array blocks, including Row 0 801, Row 1 802, Row 2 803, Row 3 804, Row 4 805, Row 5 806, and a Redundant Row 807. Also included are vertical lines including a first vertical line having portions 810 and 820, a second vertical line having portions 830 and 850, a third vertical line having portions 860 and 880, and a fourth vertical line having portions 890 and 895. A PLD may have many vertical lines. For example, a PLD may have many LABs in each row, with 10 LEs in LAB, with each LE programmably coupled to one or more vertical lines. A main buffer is placed along each vertical trace, between the two line portions. The Main Buffers 815, 840, 870, and 897 may be configured as an open, as a buffer driving in the down direction, or as a buffer driving in the upward direction.

Figure 9:
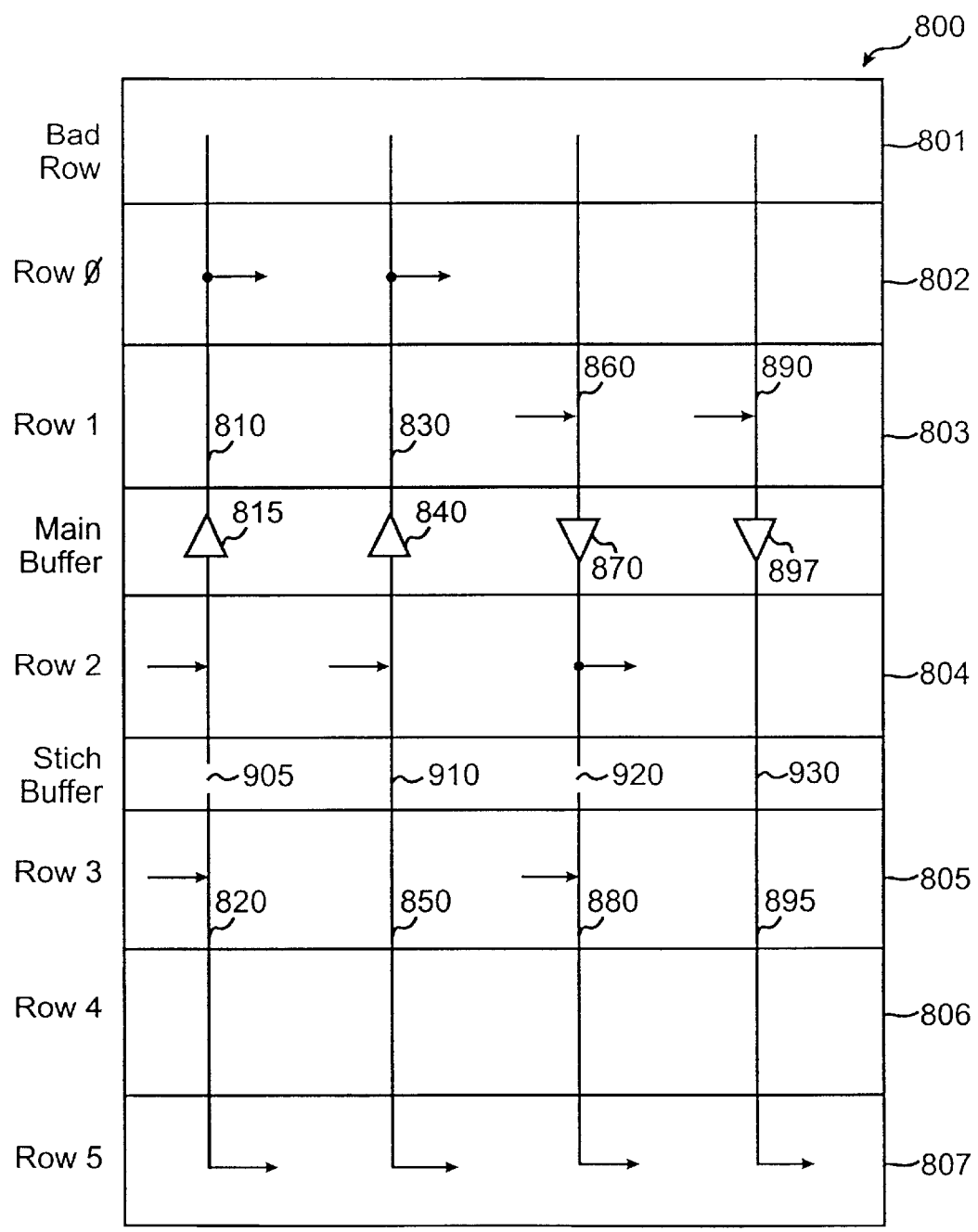
FIG. 9 is the portion of the PLD shown in FIG. 8 after circuit changes to compensate for a bad row have occurred.

Various driving and receiving connections are indicated as arrows in FIGS. 8 and 9. The arrows may indicate a programmable connection to a logic element, a programmable connection to a logic circuit through a tristate buffer, a programmable connection to a horizontal or row line or trace, or other programmable connection. For simplicity, this and similar connections are described as being to a logic element, though they may be to any of these structures. For example, a logic element in Row 2 803 provides a signal to vertical line portion 810 that is received by a receive circuit in Row 0 801. Similarly, a driving circuit in Row 3 804 provides a signal on vertical line portion 820 that is received by a logic element in Row 5 806. Further, a logic element in Row 2 803 provides a signal to vertical line portion 830 that is received by a logic element in Row 0 801, and driven by Main Buffer 840 onto vertical line portion 850, where it is received by a logic element in Row 5 806. A logic element in Row 1 802 provides a signal onto line portion 860 that is received by a logic element in Row 2 803. A logic element in Row 3 804 provides a signal onto vertical line portion 880 that is received by a logic element in Row 5 806. Main Buffer 870 is configured as an open circuit. This enables the third vertical line to be segmented into two portions wired to different logic elements 300. Also a logic elements in Row 1 drives a signal onto vertical line portion 890 which is buffered by Main Buffer 897 is a downward direction onto vertical line portion 895, were it is received by a logic element in Row 5 806.

If a defect makes Row 0 801 inoperable, the Redundant Row 807 is used. Specifically, one embodiment of the present invention moves the logic configuration of Row 0 801 down to the Row 1 802 position. Similarly, each row moves down one, such that the functionality of Row 5 806 resides in the Redundant Row 807. Again, the configuration of the main buffers may need to be altered to compensate for this shifting.

Examples of possible defects that may make a row inoperable include pinholes in the crystalline structure of the semiconductor material, open, shorts, or bridges between interconnecting metal traces, and the like. The defect may be such that one LE is nonfunctional. Alternately, the defect may cause several LEs to be nonfunctional, an entire LAB may be nonfunctional, or an entire row of LABs may be nonfunctional.

FIG. 9 again shows the representative portion 800 of a programmable logic device. In this figure, the portion 800 of the integrated circuit has been reconfigured to compensate for a defect in the top row. If a device having no defective rows is programmed, the result is the configuration in FIG. 8. But if Row 0 801 is defective, then the same programming yields the configuration in FIG. 9. That is, two integrated circuits, identical except that one has a defective Row 0, and the other does not, receive the same programming, which results in the two configurations shown in FIG. 8 and 9 respectively. As will be seen below, this is because bits of information are stored on-chip, and act to modify the programming data.

Again, a logic element in Row 2 804 drives a logic element in Row 0 802 using the first vertical line. The Main Buffer 815 is reconfigured from the open circuit shown in FIG. 8 to the driving upward configuration as shown in FIG. 9. In this way, a logic element in Row 2 804 continues to drive a logic element in Row 0 802, even though the rows have all been shifted down by one.

But a logic element in Row 3 805 is using the same vertical trace to drive a logic element in Row 5 807. Thus, without more, the logic elements in Row 2 804 and Row 3 805 would both try to drive the first vertical line. Accordingly, a Stitch Buffer 905 is added below the row that is directly below the main buffers. Specifically, the stitch buffer is added between Row 2 804 and Row 3 805. Each stitch buffer may be configured as either an open or short circuit. In this specific example, the stitch buffer is open, allowing the logic element in Row 2 804 to drive a logic element in Row 0 802, while the same vertical line, but a different line portion, is used by a logic element in Row 3 805 to drive a logic element in Row 5 807.

The PLD is programmed by externally generated signals to be configured to perform a specific function. In this example, the Main Buffer 815 is programmed to be an open. This programmably is modified on-chip such that Main Buffer 815 is instructed to drive in the upward direction. Also, the stitch buffer, which is not programmed, but defaults to a short, is instructed to form an open circuit. In this way, the line segmentation instructions are modified on-chip, enabling the programming system to use the same program, regardless of the existence and location of a defective row.

Similarly, a logic element in Row 2 804 uses the second vertical line to drive a logic element in Row 0 802. Accordingly, the Main Buffer 840 associated with the second vertical line is reconfigured from driving in the downward direction as shown in FIG. 8, to driving in the upward direction as shown in FIG. 9. Also, since the logic element in Row 2 804 is driving a logic element in Row 5 807, the Stitch Buffer 910 remains closed. In this way, a logic element in Row 2 804 continues to drive the logic elements in Row 0 802 and Row 5 807 after all rows have been shifted down by one position to compensate for the top row being nonfunctional.

A logic element in Row 1 803 and a logic element in Row 3 805 use the third vertical line to drive logic elements in Rows 2 804 and Row 5 807, respectively. Accordingly, Main Buffer 870 is reconfigured from the open state shown in FIG. 8 to the driving downward state as shown in FIG. 9. Also, since two drivers are using this line, the Stitch Buffer 920 is opened. The fourth vertical interconnect line is used by a logic element in Row 1 803 to drive a logic element in Row 5 807. In this case, there is no change to the Main Buffer 897 or Stitch Buffer 930.

As can be seen by the preceding paragraphs, by using a configurable main buffer and stitch buffer, the original interconnect configurations as shown in PLD portion 800 are preserved, even though the actual rows have moved to compensate for a defect. In this way, the long vertical lines continue to be buffered or segmented, in a manner consistent with the above described redundancy scheme.

Figure 10:
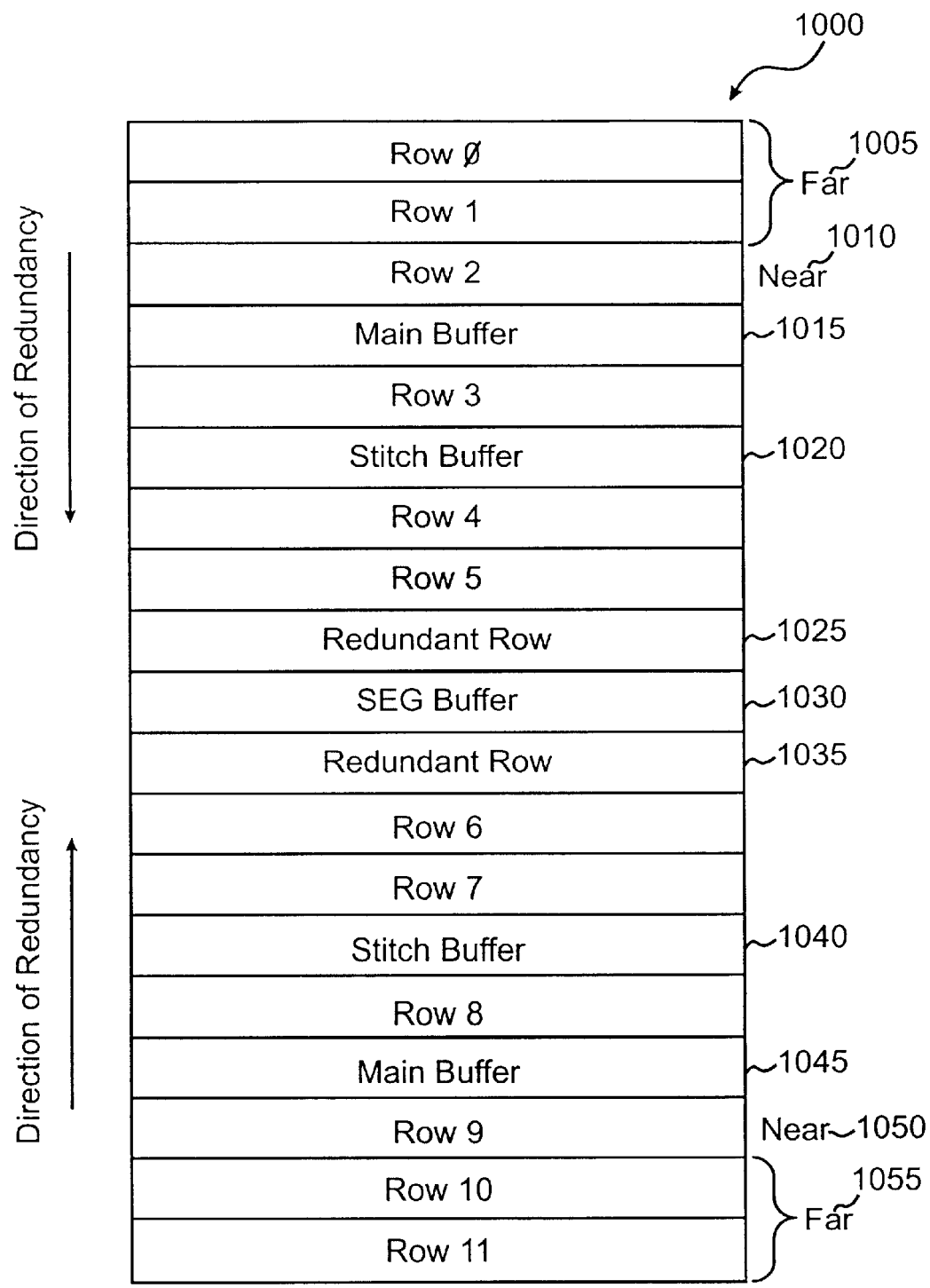
FIG. 10 shows a generalized layout for a PLD designed and arranged in a manner consistent with an embodiment of the present invention.

The pattern of rows shown in the PLD portions 800 of FIGS. 8 and 9 may be repeated and mirrored in some integrated circuits. Also, further buffering and line segmentation may be added between the two mirrored portions. FIG. 10 is an example of one such configuration. Included are Rows 0 through 5, a Redundant Row 1025, main buffer row 1015, and stitch buffer row 1020. This pattern is mirrored starting with Row 11 through Row 6 and the Redundant Row 1035, including main buffer row 1045, and stitch buffer row 1040. A separate row of segmentation buffers 1030 is added between the Redundant Rows 1025 and 1035. This configuration allows each GV or vertical line to be broken into four portions. Specifically, if there are no bad rows, each vertical line can be divided into a first portion beginning at row 0 and ending at row 2, a second portion beginning at row 3 and ending at a redundant row 1025, a third portion beginning at the redundant row 1035 and ending at row 8, and a fourth portion beginning at row nine and ending at row 11. Any two consecutive portions may be coupled together by a main buffer set up in a driving up or down configuration.

FIG. 11 is a symbolic truth table for determining the change in configuration for the main and stitch buffers depending on the location of a bad row requiring replacement, and the location of an active driving circuit on the vertical line relative to the position of the main buffer. The active driving circuit may be an LE 300, horizontal or GH line, or other programmable connection. The original programming for a main buffer is determined, and listed at in column 1110. Initially, all stitch buffers are closed (they are not programmed) as indicated in column 1120. The location of a defective row is determined and listed in 1130. There are two possible locations for a defective row, either the defective row is above the main buffer as indicated by U1 in column 1130, or below the main buffer as indicated by U2. This value can be found by checking the row above the main buffers, and determining if its function was shifted from the row above it. Next, it is determined if a vertical line driver is active in the row directly above the main buffer. This information can be programmably stored on-chip, such as in a RAM, PROM, or other memory circuit. If there is an active vertical line driver in the row directly above the main buffer, then it is said that a driver location is "near", as listed in column 1140. If not, then the driver location is said to be "far." From this information, the updated settings of the main buffer and stitch buffer are given in columns 1150 and 1160, respectively. The updated settings are the original settings in column 1110, modified by the on chip data U1 and NeFa.

Row 1170 is the symbolic representation of the example given as the first vertical line in FIGS. 8 and 9. In that case, the main buffer was opened or segmented. The bad row was the top row, represented as U1 in column 1130. A logic element in Row 2 803 is driving the first vertical line, and thus the driver location is said to be near. Accordingly, the updated settings provide that the main buffer should be configured to drive an upward direction, while the stitch buffer is opened or segmented.

The example of the second vertical trace in FIGS. 8 and 9 corresponds to row 1180 in truth table 1100. The original settings for the main buffer has it driving in the downward direction. The bad row was again at the top of the appeal the portion 800 indicated as U1 in 1130. Also, a logic element in Row 2 drives the second vertical trace. Since Row 2 803 is directly above the main buffer as shown in FIG. 8, the driver location is said to be near. Accordingly, the main buffer setting is updated to drive in the upward direction, while the stitch buffer remains stitched or closed.

The third vertical line in the example of FIG. 8 is represented by row 1190 in truth table 1100. The original setting calls for the main buffer to be segmented. The bad row is above the main buffer, and the driver location is not in the row directly above the main buffer, thus it is far. Accordingly the configurations are changed such that the main buffer drives in the downward direction, and the stitch buffer is opened or segmented, as indicated by columns 1150 and 1160. The fourth vertical line of FIG. 8 is represented by row 1195 in truth table 1100 of FIG. 11. The original configuration called for the main buffer to drive downward, and for the stitch buffer to be closed. The bad row to be replaced his above the main buffer and the driver location is far. Accordingly, the main buffer configuration and stitch buffer configuration do not change.

In this way, the programmed data for a segmentation or main buffer, and the default setting for its corresponding stitch buffer, is modified according to the existence and location of a defective row, and the location of a vertical line driver. The modified data is then used to control the main and stitch buffers, such that the same programming data yields the same result in a transparent manner, independent of the location and existence of the defective row. This enables integrated circuits with bad rows, and those without defect, to be sold and programmed together without distinction.

FIG. 12 is a truth table which may be used in designing control logic circuitry for main and stitch buffers in PLDs consistent with embodiments of the present invention. Included are inputs RLTRT 1212, RRTLT 1214, NeFa 1216, and U1 1218, as well as outputs RLTRTx 1222, RRTLTx 1224, and Sub_Buf 1226. The figure also provides the Boolean equations 1270 for the logic outputs. A high or 1 for input signal RLTRT 1212 indicates that a signal should be passed from left to right through the main buffer, before any is made to compensate for a bad row. Note that a signal being passed from left to right means that a signal is being passed up a GV or vertical trace, and that a signal moving from right to left his being passed down a vertical trace. As above, the directions up, down, left, and right are given for exemplary purposes only. The signals may well pass up or down, or left or right, or in a nonorthogonal direction. A high or a 1 for the input signal are RRTLT 1214 indicates that the main buffer should pass the signal from right to left. A one for the NeFa 1216 signal indicates that there is an active driver located in the row directly above the main buffers before any shifting to compensate for a defective row occurs. Again, the active driver may be an LE 300, horizontal interconnect or GH line, or other programmable connection. A high or one for input signal U1 1218 indicates that the bad row is above the main buffer.

A high for output signal RLTRTx 1222 indicates that before any row shifting has taken place, the main buffer should pass the signal from left to right. An "X" indicates that a particular state cannot occur. Specifically, row 1230 does not occur since a buffer driving in the upward direction would compete with a driver in the row directly above the main buffer. Since the circuitry should not be configured with two competing drivers, that state does not occur. State 1240 also does not occur since the main buffer cannot simultaneously pass data from left to right and right to left.

A high or a 1 for output signal RRTLTx 1224 indicates that after row shifting has taken place, the main buffer should pass data from right to left. A high or a 1 for output signal Sub_Buf 1226 indicates that the stitch buffer should be in the stitch or closed position and a low or a zero indicates that the stitch buffer should be segmented or opened. Equations 1227 define the output signals 1220 as functions of the input signals 1210.

The value of NeFa 1216 can be stored on chip, for example in a RAM, PROM, Flash memory, flip-flop, or other storage circuit. A bit for each row, indicating whether the row functionality stays where it is, or shifts by one row, can also be stored. This information allows generic programming data from the outside to be modified on chip to properly compensate for the existence of a bad row. The value of U1 thus can be determined by checking the bit which instructs the row directly above the segmentation whether to shift or not.

Figure 13:
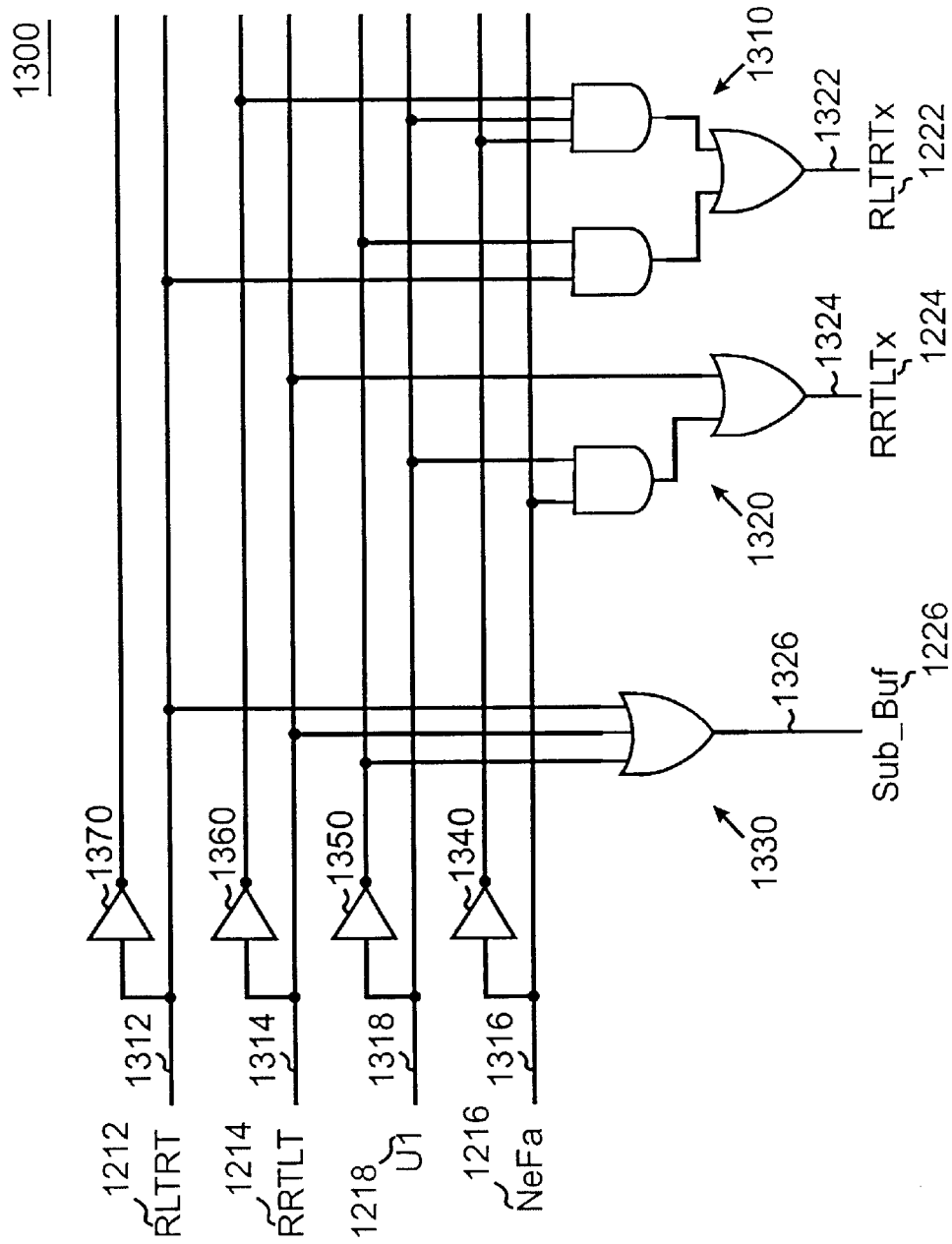
FIG. 13 shows a control logic circuitry implementation of FIG. 12.

FIG. 13 is a schematic of a logic block designed to implement the truth table 1200 shown in FIG. 12. Included are input signals RLTRT 1212, RRTLT 1214, U1 1218, and NeFa 1216, which are applied to input lines 1312, 1314, 1318, and 1316 respectively. Each input signal is inverted by an inverters 1370, 1360, 1350, and 1340 respectively. The input signals and their inverted versions are applied as inputs to logic gate combinations 1310, 1320, and 1330. These logic gate combinations provide resulting output signals RLTRTx 1222, RRTLTx 1224, and Sub_Buf 1226 on lines 1322, 1324, and 1326 respectively. The logic implementations shown uses AND as well as OR gates, along with the previously mentioned inverters. It will be obvious to one skilled in the art that other logic configurations can be used to implement the same or similar logic functions. For example, NAND gates and NOR gates may also be used to implement the logic gate combinations 1310, 1320, and 1330.

Figure 14:
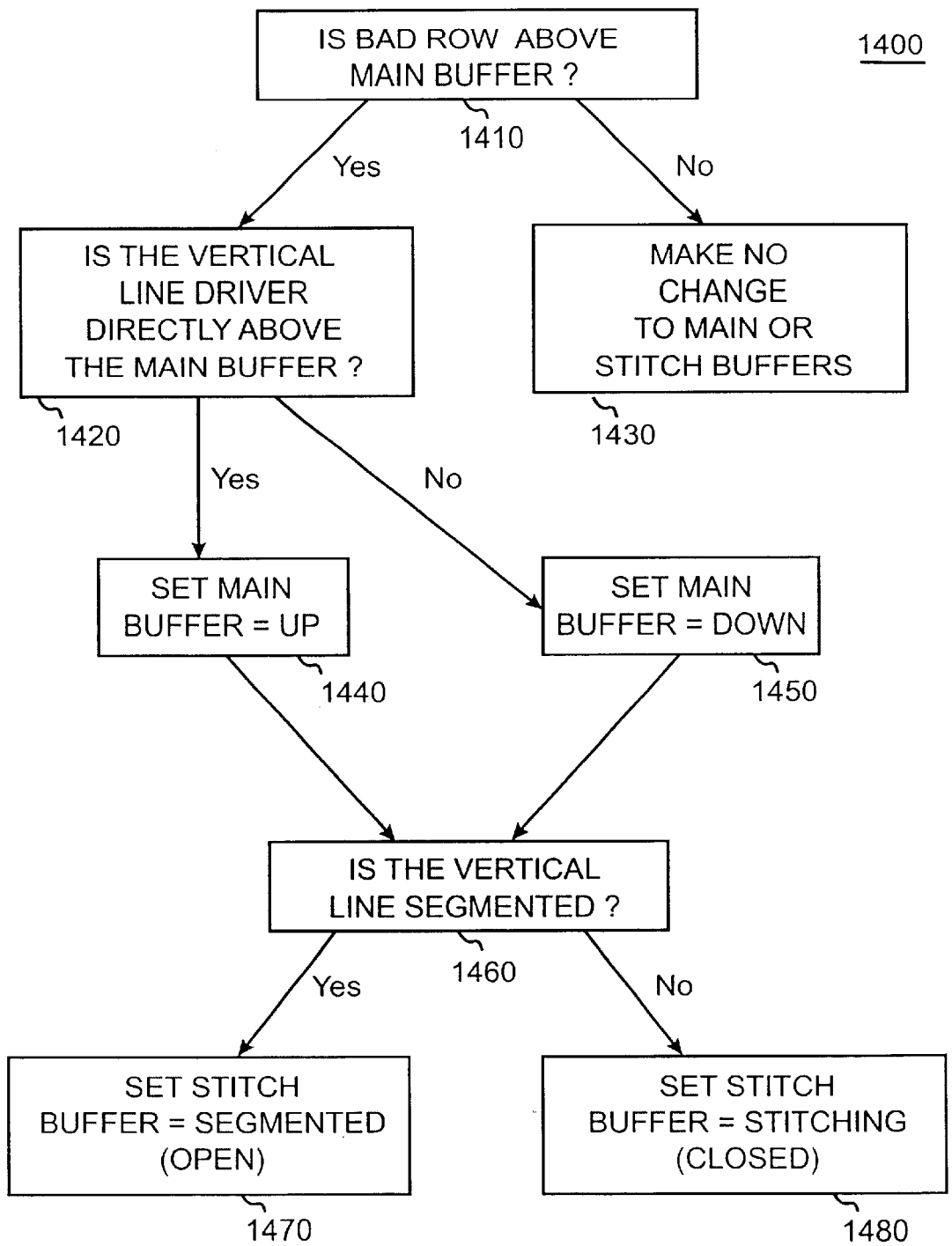
FIG. 14 is a flow chart for changing states of the control logic of the main and stitch buffers as a function of defective row and line driver locations.

FIG. 14 is a flow chart showing the decision-making process for setting the main buffer and stitch buffers consistent with an embodiment of the present convention. In act 1410 it is determined whether there is a defective row above the main buffer. If the answer is no, either because the bad row is below the main buffer, or there is no defective row, then no change is made to the main and stitch buffers in act 1430. If there is a bad row, and it is above the main buffer, then in act 1420 it is determined whether there is an active vertical driver in the row directly above the main buffer. If the answer is no, the main buffer is set to drive in the downward direction in act 1450. If there is an active vertical line driver in the row directly above the main buffer, then the main buffer is set to drive upward in act 1440. In act 1460 is determined whether the vertical line is segmented by the main buffer in question. If it is not, then the stitch buffer remains closed in act 1480. If the vertical line is segmented by the main buffer, then the stitch buffer assumes the segmenting task and is opened in act 1470.

Figure 15:
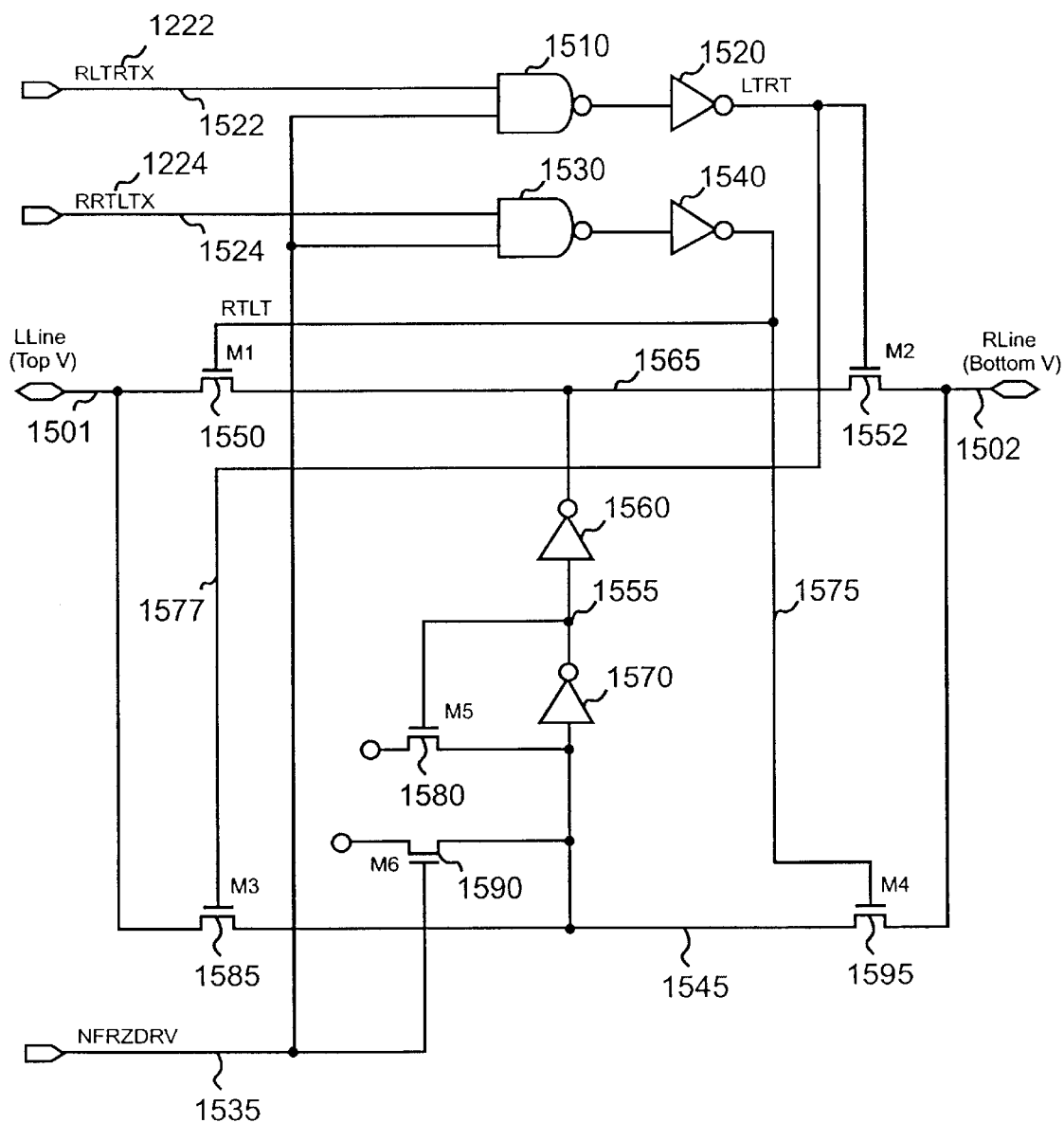
FIG. 15 is a schematic of a main buffer.

FIG. 15 is a schematic of a main buffer consistent with one embodiment of the present invention. Included are inputs RLTRTx 1222, RRTLTx 1224, vertical line connections LLINE on line 1501 and RLINE on line 1502, as well as an enabled signal NFRXDRV on line 1535. If the enable signal NFRXDRV on line 1535 is high, then a high on signal RLTRTx 1222 on line 1522 drives the signal LTRT on line 1577 high. This in turn couples line 1501 to line 1545 through device M3 1585. Also, line 1565 is coupled to line 1502 through device M2 1552. Accordingly, a signal LLINE on line 1501 drives inverters 1570 and 1560 resulting in a signal RLINE on line 1502.

Conversely, if the enable signal NFRXDRV on line 1535 is high, a high for signal RRTLTx 1224 on line 1524 drives the signal RTLT on line 1575 high. This in turn couples line 1502 to line 1545 through device M4 1595. Also, line 1565 is coupled to line 1501 through device M1 1550. Accordingly, a signal RLINE on line 1502 drives inverters 1570 and 1560 resulting in a signal LLINE on line 1501. If either the enable signal NFRXDRV on line 1535 is low, or neither signal RLTRTx 1222 or RRTLTx 1224 are high, then device M1 1550, M2 1550, M3 1585, and M4 1595, are all open and non-conducting. In this condition, a high impedance is seen between line 1501 and line 1502 and the main buffer is segmented.

Figure 16:
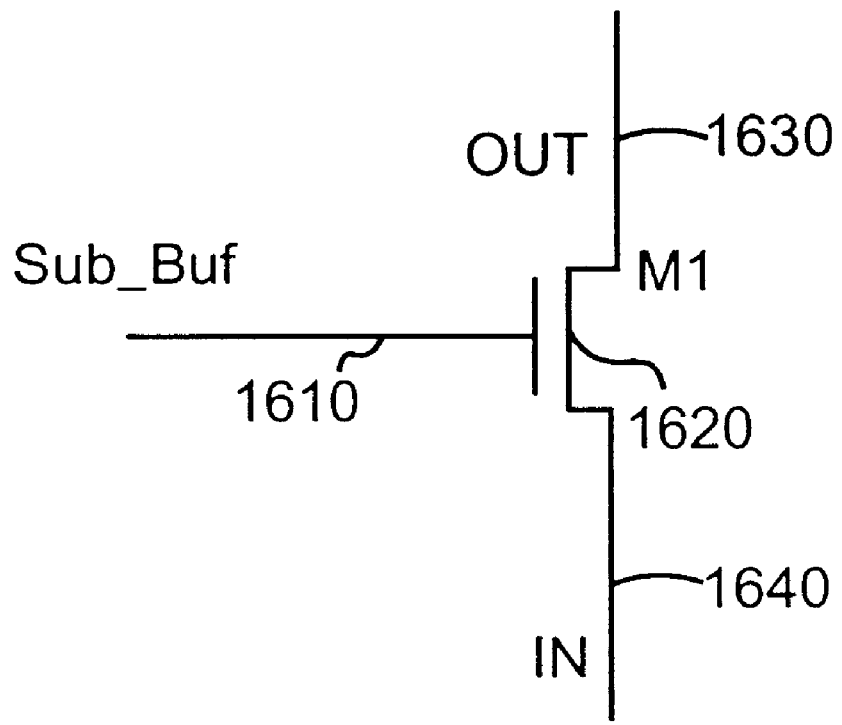
FIG. 16 is a schematic of a stitch buffer.

FIG. 16 and is a schematic of a Stitch Buffer 1600 consistent with one embodiment of the present convention. Included is device M1 1620. The drain and source regions of device M1 1620 form the input and output nodes 1640 and 1630 respectively. The gate or control electrode of device M1 1620 receives the Sub_Buf signal on line 1610 from logic block 1300, or other control logic block. If the Sub_Buf signal on line 1610 is high, the buffer is in the stitch or short configuration, which is the default state of the stitch buffer. If the Sub_Buf signal on line 1610 is low, the buffer is open or segmented.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the following claims.

What is claimed is:

1. A programmable logic device comprising:
    a first plurality of logic array blocks arranged contiguously;
    a plurality of segmentation buffers arranged contiguously and along a side of the first plurality of logic array blocks,
    a second plurality of logic array blocks arranged contiguously and along a side of the plurality of segmentation buffers away from the first plurality of logic array blocks;
    a plurality of stitch buffers arranged contiguously and along a side of the second plurality of logic array blocks away from the plurality of segmentation buffers;
    a third plurality of logic array blocks arranged contiguously and along a side of the plurality of stitch buffers away from the second plurality of logic array blocks;
    a fourth plurality of logic array blocks arranged contiguously and along a side of the third plurality of logic gates away from the plurality of stitch buffers;
    a first plurality of interconnect lines programmably coupled to the first plurality of logic array blocks and coupled to the plurality of segmentation buffers;
    a second plurality of interconnect lines programmably coupled to the second plurality of logic array blocks, and coupled to the plurality of segmentation buffers and to the plurality of stitch buffers; and
    a third plurality of interconnect lines programmably coupled to the third plurality of logic array blocks and the fourth plurality of logic array blocks, and coupled to the plurality of stitch buffers,
    wherein the plurality of segmentation buffers are capable of being configured to drive signals from the first plurality of interconnect lines to the second plurality of interconnect lines, or to drive signals from the second plurality of interconnect lines to the first plurality of interconnect lines, or to provide an open circuit between the first plurality of interconnect lines and the second plurality of interconnect lines.

2. The programmable logic device of claim 1 wherein the plurality of stitch buffers are capable being configured to couple the second plurality of interconnect lines to the third plurality of interconnect lines, or to provide an open circuit between the second plurality of interconnect lines and the third plurality of interconnect lines.

3. The programmable logic device of claim 2 wherein the first plurality of logic array blocks is arranged in a first plurality of rows, and the third plurality of logic array blocks is arranged in a second plurality of rows.

4. The programmable logic device of claim 3 wherein the second plurality of logic array blocks is arranged in a first row, and the fourth plurality of logic array blocks is arranged in a second row.

5. The programmable logic device of claim 4 wherein a function is initially associated with each of the first plurality of rows, the second plurality of rows, the first row, and no function is initially associated with the second row.

6. The programmable logic device of claim 5 wherein if a logic array block is nonfunctional, the functions initially associated with the rows including its row, and those between its row of logic blocks and the second row of logic blocks, are each moved one row in the direction of the second row.

7. The programmable logic device of claim 6 wherein the configuration of the first plurality of segmentation buffers may change if a logic array block is nonfunctional.

8. The programmable logic device of claim 6 wherein the configuration of the first plurality of segmentation buffers may change if a logic array block is nonfunctional, and the nonfunctional logic array block is in the first plurality of logic array blocks.

9. The programmable logic device of claim 8 further comprising:
    a control circuit, wherein the control circuit generates control signals which determine the configuration of the plurality of segmentation buffers and the plurality of stitch buffers.

10. An integrated circuit comprising the programmable logic device of claim 6.

11. A method of segmenting programmable interconnect lines in a programmable logic device comprising a segmentation buffer, a plurality of redundant logic array blocks, a first plurality of logic array blocks on a first side of the segmentation buffer and between the segmentation buffer and the plurality of redundant logic array blocks, and a second plurality of logic array blocks on a second side of the segmentation buffer and not between the segmentation buffer and the plurality of redundant logic array blocks, the method comprising:
    determining whether a defective logic array block exists; and
    if no defective logic array block exists, making no changes to the segmentation buffer; else
    determining a location of a defective logic array block; and
    if the location of the defective logic array block is in the first plurality of logic array blocks, making no changes to the segmentation buffer; else
    determining the location of an active line driver for a line coupled to the segmentation buffer; and
    if the location of the active line driver is in a logic array block next to the second side of segmentation buffer, setting the segmentation buffer to drive signals from the first plurality of logic array blocks to the second plurality of logic array blocks; else
    setting the segmentation buffer to drive signals from the second plurality of logic array blocks to the first plurality of logic array blocks.

12. The method of claim 11 wherein the first and second pluralities of logic array blocks are arranged in rows.

13. The method of claim 12 wherein the programmable logic device further comprises a stitch buffer, the stitch buffer located one row of logic array blocks away from the segmentation buffer, and between the segmentation buffer and the redundant row of logic array blocks, the stitch buffer capable of being configured as an open or a short circuit.

14. The method of claim 13 further comprising:

determining an initial configuration of the segmentation buffer, and if the segmentation buffer is initially configured as an open, setting the stitch buffer to provide an open circuit, else setting the stitch buffer to provide a short circuit.

15. The method of claim 14 wherein the programmable logic device further comprises a control circuit, wherein the control circuit determines the configuration of the segmentation buffer and the stitch buffer.

16. An integrated circuit comprising:

a first plurality of logic blocks;

a first plurality of buffers disposed in a first direction from the first plurality of logic blocks;

a second plurality of logic blocks disposed in the first direction from the first plurality of buffers and the first plurality of logic blocks;

a second plurality of buffers disposed in the first direction from the second plurality of logic blocks, the first plurality of buffers, and the first plurality of logic blocks;

a third plurality of logic blocks disposed in the first direction from the second plurality of buffers, the second plurality of logic blocks, the first plurality of buffers, and the first plurality of logic blot;

a first plurality of interconnect lines programmably coupled to the first plurality of logic blocks and coupled to the first plurality of buffers;

a second plurality of interconnect lines programmably coupled to the second plurality of logic blocks, and coupled to the first plurality of buffers and the second plurality of buffers; and a third plurality of interconnect lines programmably coupled to the third plurality of logic blocks and coupled to the second plurality of buffers, wherein each of the first plurality of buffers are capable of being configured to buffer a signal on one of the first plurality of interconnect lines to one of the second plurality of interconnect lines, to buffer a signal on one of the second plurality of interconnect lines to one of the first plurality of interconnect lines, or to provide a high impedance between one of the first plurality of interconnect lines and one of the second plurality of interconnect lines, and wherein each of the second plurality of buffers is capable of being configured to provide a low impedance between one of the second plurality of interconnect lines and one of the third plurality of interconnect lines or to provide a high impedance between one of the second plurality of interconnect lines and one of the third plurality of interconnect lines.

17. The integrated circuit of claim 16 wherein the third plurality of logic blocks includes redundant logic blocks.

18. The integrated circuit of claim 17 wherein if a logic block in the first plurality of logic blocks is nonfunctional, functions associated with logic blocks between the nonfunctional logic block and the redundant logic blocks are shifted in the first direction.

19. The integrated circuit of claim 16 wherein the first plurality of logic blocks are arranged in a first plurality of rows, the second plurality of logic blocks are arranged in a single row, and the third plurality of logic blocks are arranged in a second plurality of rows.

20. The integrated circuit of claim 16 wherein the second plurality of buffers are initially configured to provide a low impedance between one of the second plurality of interconnect lines and one of the third plurality of interconnect lines.

* * * * *